(12) United States Patent
Pagaila et al.

(10) Patent No.: US 9,177,901 B2
(45) Date of Patent: Nov. 3, 2015

(54) SEMICONDUCTOR DEVICE AND METHOD OF STACKING DIE ON LEADFRAME ELECTRICALLY CONNECTED BY CONDUCTIVE PILLARS

(75) Inventors: Reza A. Pagaila, Singapore (SG); Byung Tai Do, Singapore (SG); Linda Pei Ee Chua, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/430,538

(22) Filed: Mar. 26, 2012

(65) Prior Publication Data

US 2012/0181673 A1    Jul. 19, 2012

Related U.S. Application Data

(63) Continuation of application No. 12/545,357, filed on Aug. 21, 2009, now Pat. No. 8,169,058.

(51) Int. Cl.
*H01L 23/49* (2006.01)
*H01L 23/495* (2006.01)
(Continued)

(52) U.S. Cl.
CPC ........ *H01L 23/49575* (2013.01); *H01L 21/568* (2013.01); *H01L 23/49517* (2013.01); *H01L 23/49541* (2013.01); *H01L 23/3107* (2013.01); *H01L 24/48* (2013.01); *H01L 25/0657* (2013.01); *H01L 2224/04105* (2013.01); *H01L 2224/16* (2013.01); *H01L 2224/16145* (2013.01); *H01L 2224/16225* (2013.01); *H01L 2224/16245* (2013.01); *H01L 2224/32145* (2013.01); *H01L 2224/48091* (2013.01); *H01L 2224/73253* (2013.01); *H01L 2224/73259* (2013.01);

(Continued)

(58) Field of Classification Search
CPC ..................................................... H01L 21/568
USPC .......... 438/106–127; 257/659–660, E23.114, 257/E23.116, E21.502
See application file for complete search history.

(56) References Cited

U.S. PATENT DOCUMENTS 5,250,843 A    10/1993   Eichelberger
5,353,498 A    10/1994   Fillion et al.
(Continued)

FOREIGN PATENT DOCUMENTS

CN    1543291 A    11/2004
CN    1983533 A     6/2007
(Continued)

*Primary Examiner* — Yu-Hsi D Sun
*Assistant Examiner* — Ankush Singal
(74) *Attorney, Agent, or Firm* — Robert D. Atkins; Patent Law Group: Atkins and Associates, P.C.

(57) ABSTRACT

A semiconductor device has a first semiconductor die mounted to a first contact pad on a leadframe or substrate with bumps. A conductive pillar is formed over a second semiconductor die. The second die is mounted over the first die by electrically connecting the conductive pillar to a second contact pad on the substrate with bumps. The second die is larger than the first die. An encapsulant is deposited over the first and second die. Alternatively, the conductive pillars are formed over the substrate around the first die. A heat sink is formed over the second die, and a thermal interface material is formed between the first and second die. An underfill material is deposited under the first semiconductor die. A shielding layer is formed between the first and second die. An interconnect structure can be formed over the second contact pad of the substrate.

31 Claims, 10 Drawing Sheets

(51) Int. Cl.
*H01L 21/56* (2006.01)
*H01L 23/31* (2006.01)
*H01L 23/00* (2006.01)
*H01L 25/065* (2006.01)

(52) U.S. Cl.
CPC ............... *H01L2224/81005* (2013.01); *H01L 2924/01004* (2013.01); *H01L 2924/01078* (2013.01); *H01L 2924/01079* (2013.01); *H01L 2924/01322* (2013.01); *H01L 2924/09701* (2013.01); *H01L 2924/13091* (2013.01); *H01L 2924/15311* (2013.01); *H01L 2924/18161* (2013.01); *H01L 2924/3025* (2013.01)

(56) References Cited

U.S. PATENT DOCUMENTS

| | | |
|---|---|---|
| 5,543,657 A | 8/1996 | Diffenderfer et al. |
| 5,742,100 A * | 4/1998 | Schroeder et al. ............ 257/778 |
| 5,770,888 A | 6/1998 | Song et al. |
| 5,841,193 A | 11/1998 | Eichelberger |
| 6,020,629 A | 2/2000 | Farnworth et al. |
| 6,291,892 B1 | 9/2001 | Yamaguchi |
| 6,297,547 B1 | 10/2001 | Akram |
| 6,380,624 B1 | 4/2002 | Hung |
| 6,417,462 B1 | 7/2002 | Dabral et al. |
| 6,590,281 B2 | 7/2003 | Wu et al. |
| 6,664,644 B2 | 12/2003 | Morozumi |
| 6,730,544 B1 | 5/2004 | Yang |
| 6,765,287 B1 | 7/2004 | Lin |
| 6,881,607 B2 * | 4/2005 | Farnworth ............... 438/106 |
| 7,023,085 B2 | 4/2006 | Pu |
| 7,071,568 B1 | 7/2006 | Amand et al. |
| 7,180,165 B2 | 2/2007 | Ellsberry et al. |
| 7,186,588 B1 | 3/2007 | Bayan et al. |
| 7,235,871 B2 | 6/2007 | Corisis |
| 7,261,596 B2 | 8/2007 | Akaike et al. |
| 7,361,531 B2 | 4/2008 | Sharma et al. |
| 7,368,811 B2 * | 5/2008 | Kang et al. ............... 257/686 |
| 7,476,980 B2 | 1/2009 | Rebibis et al. |
| 7,550,832 B2 * | 6/2009 | Weng et al. ............... 257/685 |
| 7,550,857 B1 * | 6/2009 | Longo et al. ............... 257/777 |
| 7,579,691 B2 | 8/2009 | Sukegawa et al. |
| 7,608,921 B2 | 10/2009 | Pendse |
| 7,615,854 B2 | 11/2009 | Montgomery |
| 7,619,901 B2 | 11/2009 | Eichelberger et al. |
| 7,714,453 B2 | 5/2010 | Khan et al. |
| 7,728,420 B2 | 6/2010 | Cheah et al. |
| 7,745,918 B1 | 6/2010 | Woodyard |
| 7,790,504 B2 | 9/2010 | Ramakrishna et al. |
| 7,834,464 B2 | 11/2010 | Meyer et al. |
| 7,838,337 B2 * | 11/2010 | Marimuthu et al. .......... 438/110 |
| 7,843,052 B1 * | 11/2010 | Yoo et al. ............... 257/686 |
| 7,880,280 B2 | 2/2011 | Otremba |
| 7,955,942 B2 * | 6/2011 | Pagaila et al. ............... 438/381 |
| 7,964,450 B2 * | 6/2011 | Camacho et al. ............ 438/127 |
| 8,039,384 B2 * | 10/2011 | Pagaila et al. ............... 438/612 |
| 8,067,827 B2 | 11/2011 | Corisis |
| 8,158,888 B2 | 4/2012 | Shen et al. |
| 8,184,453 B1 * | 5/2012 | Kim et al. ............... 361/813 |
| 8,357,564 B2 * | 1/2013 | Chi et al. ............... 438/108 |
| 2002/0028327 A1 | 3/2002 | Perry et al. |
| 2002/0098676 A1 | 7/2002 | Ning et al. |
| 2003/0020151 A1 | 1/2003 | Chen et al. |
| 2003/0032216 A1 * | 2/2003 | Nakaoka et al. ............ 438/106 |
| 2003/0178719 A1 | 9/2003 | Combs et al. |
| 2003/0218250 A1 * | 11/2003 | Kung et al. ............... 257/737 |
| 2004/0036164 A1 | 2/2004 | Koike et al. |
| 2004/0067605 A1 | 4/2004 | Koizumi |
| 2004/0070064 A1 | 4/2004 | Yamane et al. |
| 2004/0075164 A1 | 4/2004 | Pu et al. |
| 2004/0089943 A1 | 5/2004 | Kirigaya et al. |
| 2004/0155359 A1 | 8/2004 | Shen |
| 2004/0160752 A1 | 8/2004 | Yamashita et al. |
| 2004/0178499 A1 | 9/2004 | Mistry et al. |
| 2004/0219717 A1 * | 11/2004 | Takahashi et al. ............ 438/108 |
| 2004/0238857 A1 * | 12/2004 | Beroz et al. ............... 257/232 |
| 2004/0262774 A1 * | 12/2004 | Kang et al. ............... 257/777 |
| 2004/0262811 A1 | 12/2004 | Lee et al. |
| 2005/0006730 A1 | 1/2005 | Owens et al. |
| 2005/0077626 A1 * | 4/2005 | Seiller et al. ............... 257/748 |
| 2005/0156296 A1 | 7/2005 | Wang et al. |
| 2005/0167812 A1 | 8/2005 | Yoshida et al. |
| 2006/0006517 A1 | 1/2006 | Lee et al. |
| 2006/0102994 A1 | 5/2006 | Pu |
| 2006/0125042 A1 * | 6/2006 | Fuergut et al. ............... 257/499 |
| 2006/0128068 A1 | 6/2006 | Murray et al. |
| 2007/0122940 A1 | 5/2007 | Gautham |
| 2007/0158832 A1 | 7/2007 | Takaike |
| 2007/0181990 A1 | 8/2007 | Huang et al. |
| 2007/0254404 A1 | 11/2007 | Gerber et al. |
| 2007/0262346 A1 | 11/2007 | Otremba et al. |
| 2007/0290338 A1 | 12/2007 | Kuczynski |
| 2007/0290376 A1 | 12/2007 | Zhao et al. |
| 2008/0017968 A1 * | 1/2008 | Choi et al. ............... 257/686 |
| 2008/0029869 A1 * | 2/2008 | Kwon et al. ............... 257/686 |
| 2008/0054434 A1 | 3/2008 | Kim |
| 2008/0054437 A1 * | 3/2008 | Hwang ............... 257/686 |
| 2008/0088019 A1 | 4/2008 | Lin et al. |
| 2008/0090405 A1 | 4/2008 | Fitzgerald et al. |
| 2008/0099925 A1 | 5/2008 | Irsigler et al. |
| 2008/0122059 A1 | 5/2008 | Chou et al. |
| 2008/0230879 A1 | 9/2008 | Sharma et al. |
| 2008/0230898 A1 | 9/2008 | Meguro et al. |
| 2008/0284001 A1 * | 11/2008 | Mori et al. ............... 257/712 |
| 2008/0315375 A1 | 12/2008 | Eichelberger et al. |
| 2008/0316714 A1 | 12/2008 | Eichelberger et al. |
| 2009/0072368 A1 | 3/2009 | Hu et al. |
| 2009/0079067 A1 | 3/2009 | Gerber |
| 2009/0091022 A1 * | 4/2009 | Meyer et al. ............... 257/723 |
| 2009/0108425 A1 | 4/2009 | Lee et al. |
| 2009/0115042 A1 | 5/2009 | Koyanagi |
| 2009/0127700 A1 | 5/2009 | Romig |
| 2009/0166886 A1 | 7/2009 | Kim et al. |
| 2009/0170241 A1 * | 7/2009 | Shim et al. ............... 438/107 |
| 2009/0212401 A1 | 8/2009 | Do et al. |
| 2009/0224391 A1 * | 9/2009 | Lin et al. ............... 257/690 |
| 2009/0236720 A1 | 9/2009 | Yoon et al. |
| 2009/0278244 A1 | 11/2009 | Dunne et al. |
| 2009/0302227 A1 | 12/2009 | Keyser et al. |
| 2010/0000775 A1 * | 1/2010 | Shen et al. ............... 174/260 |
| 2010/0019362 A1 * | 1/2010 | Galera et al. ............... 257/676 |
| 2010/0025829 A1 | 2/2010 | Mengel et al. |
| 2010/0084749 A1 | 4/2010 | Hong et al. |
| 2010/0133655 A1 | 6/2010 | Nakanishi |
| 2010/0133665 A1 | 6/2010 | Ha et al. |
| 2010/0136749 A1 | 6/2010 | Bayan et al. |
| 2010/0164078 A1 | 7/2010 | Madrid et al. |
| 2010/0230792 A1 | 9/2010 | Irving et al. |
| 2010/0237495 A1 * | 9/2010 | Pagaila et al. ............... 257/700 |
| 2010/0276792 A1 * | 11/2010 | Chi et al. ............... 257/660 |
| 2010/0289126 A1 | 11/2010 | Pagaila et al. |
| 2010/0289131 A1 | 11/2010 | Bathan et al. |
| 2011/0024888 A1 * | 2/2011 | Pagaila et al. ............... 257/686 |
| 2011/0037155 A1 * | 2/2011 | Pagaila ............... 257/686 |
| 2011/0037169 A1 * | 2/2011 | Pagaila ............... 257/737 |
| 2011/0042798 A1 | 2/2011 | Pagaila et al. |
| 2011/0068444 A1 * | 3/2011 | Chi et al. ............... 257/669 |
| 2011/0186977 A1 | 8/2011 | Chi et al. |
| 2011/0204472 A1 * | 8/2011 | Pagaila et al. ............... 257/528 |
| 2011/0254155 A1 * | 10/2011 | Lin et al. ............... 257/737 |
| 2011/0278707 A1 * | 11/2011 | Chi et al. ............... 257/676 |
| 2011/0278741 A1 * | 11/2011 | Chua et al. ............... 257/777 |
| 2011/0291257 A1 * | 12/2011 | Pagaila ............... 257/693 |
| 2012/0038064 A1 * | 2/2012 | Camacho et al. ............ 257/777 |
| 2012/0193789 A1 * | 8/2012 | Hu et al. ............... 257/738 |

FOREIGN PATENT DOCUMENTS

| | | |
|---|---|---|
| KR | 20030045950 | 6/2003 |
| WO | 2005119776 | 12/2005 |

* cited by examiner

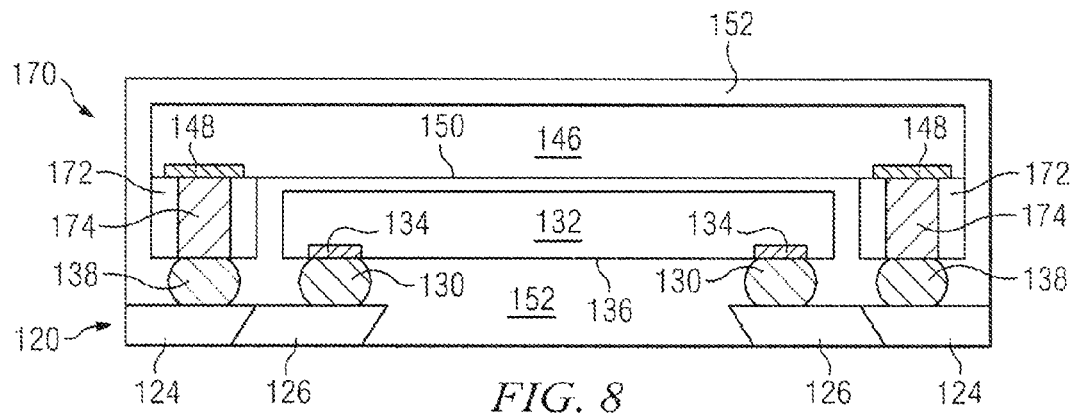

SEMICONDUCTOR DEVICE AND METHOD OF STACKING DIE ON LEADFRAME ELECTRICALLY CONNECTED BY CONDUCTIVE PILLARS

CLAIM OF DOMESTIC PRIORITY

The present application is a continuation of U.S. patent application Ser. No. 12/545,357, now U.S. Pat. No. 8,169,058, filed Aug. 21, 2009, and claims priority to the foregoing application pursuant to 35 U.S.C. §120.

FIELD OF THE INVENTION

The present invention relates in general to semiconductor devices and, more particularly, to a semiconductor device and method of stacking die on a leadframe and electrically connecting the die through conductive pillars.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In FIG. 1, a conventional flipchip type semiconductor die 10 and wire-bonded semiconductor die 12 are stacked on leadframe 14. The smaller semiconductor die 10 is mounted to leadframe 14 with bumps 16. The larger semiconductor die 12 is stacked over the smaller semiconductor die 10 with die attach adhesive 18. Semiconductor die 12 is electrically connected to leadframe 14 using bond wires 20. An encapsulant 22 is deposited over semiconductor die 10 and 12. The stacked semiconductor die with bump and bond wire interconnects increases the size requirements of the leadframe, which adds to manufacturing costs. The relatively long signal path length for semiconductor die 12, due to bond wires 20, degrades electrical performance. The overhang of the larger semiconductor die 12 can cause a bounce or cantilever effect during the wire-bonding process.

In some cases, flipchip type semiconductor die are mounted to a leadframe in a quad flat no-lead package (QFN). Flipchip die are low cost and provide fast signal propagation due to minimal lead lengths. To mount multiple flip-chip die on the leadframe, the die can be mounted side-by-side, which requires a large leadframe area. To stack the flipchip die vertically, the electrical interconnect between the die becomes problematic. A solder bump interconnect has the limitation of collapsing upon reflow, especially for the large bumps needed for stacked die. In addition, the large bumps also limit input/output (I/O) pitch and I/O pin count.

SUMMARY OF THE INVENTION

A need exists to stack semiconductor die in a QFN package and provide a reliable interconnect structure. Accordingly, in one embodiment, the present invention is a method of making a semiconductor device comprising the steps of providing a substrate, mounting a first semiconductor die over the substrate, mounting a second semiconductor die over the first semiconductor die and substrate with a plurality of stacked conductive pillars and first bumps disposed between the second semiconductor die and substrate, and depositing an encapsulant over the first semiconductor die and second semiconductor die. The second semiconductor die is electrically connected to the first semiconductor die through the conductive pillars and first bumps.

In another embodiment, the present invention is a method of making a semiconductor device comprising the steps of providing a substrate, mounting a first semiconductor component to the substrate, mounting a second semiconductor component over the first semiconductor component and substrate with a plurality of stacked conductive pillars and bumps disposed between the second semiconductor component and substrate outside a footprint of the first semiconductor component, and depositing an encapsulant over the first semiconductor component and second semiconductor component.

In another embodiment, the present invention is a method of making a semiconductor device comprising the steps of providing a substrate, stacking first and second semiconductor components over the substrate with a conductive pillar disposed between the second semiconductor component and substrate outside a footprint of the first semiconductor component, and depositing an encapsulant over the first semiconductor component and second semiconductor component.

In another embodiment, the present invention is a semiconductor device comprising a substrate and first and second semiconductor components stacked over the substrate. A conductive pillar is disposed between the second semiconductor component and substrate outside a footprint of the first semiconductor component. An encapsulant is deposited over the first semiconductor component and second semiconductor component.

BRIEF DESCRIPTION OF THE DRAWINGS

FIG. 8 illustrates semiconductor die stacked over the leadframe with insulating material around the conductive pillars;

FIG. 9 illustrates semiconductor die stacked over the leadframe with multiple contact pads;

FIG. 10 illustrates semiconductor die stacked over the leadframe with multiple contact pads of different thickness;

DETAILED DESCRIPTION OF THE DRAWINGS

Figure 1:
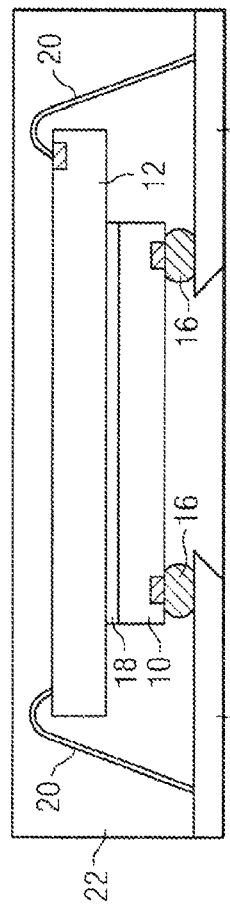
FIG. 1 shows a conventional semiconductor die stacked on a leadframe.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
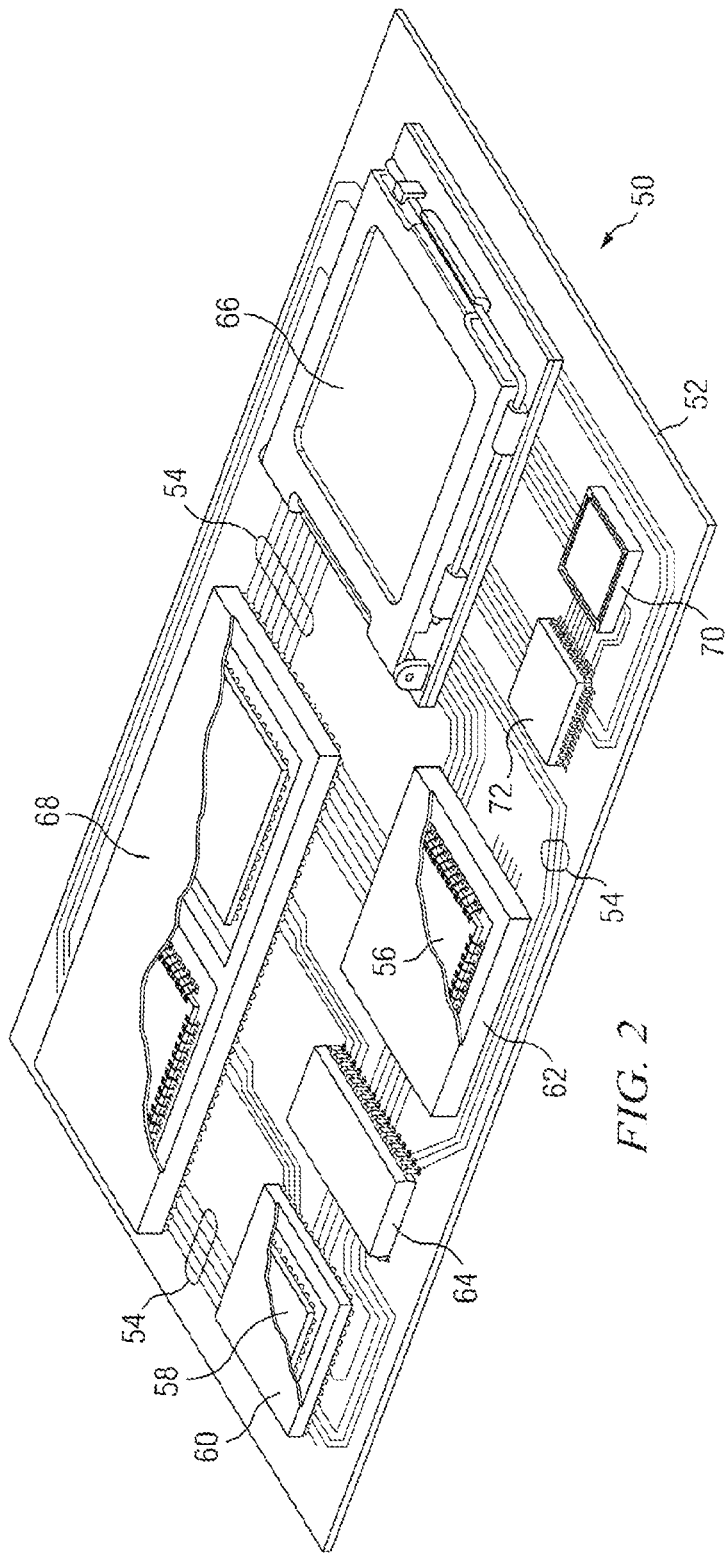
FIG. 2 illustrates a PCB with different types of packages mounted to its surface.

FIG. 2 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 2 for purposes of illustration.

Electronic device 50 may be a stand-alone system that uses the semiconductor packages to perform one or more electrical functions. Alternatively, electronic device 50 may be a sub-component of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
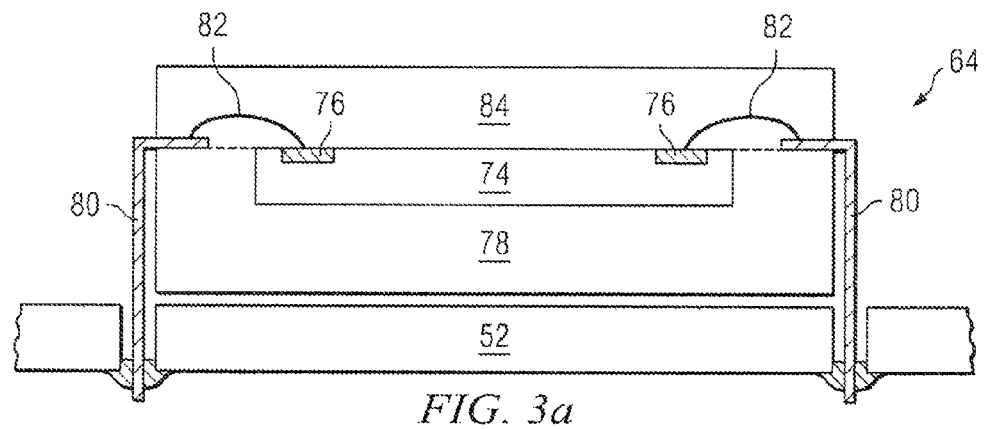
FIGS. 3a-3c illustrate further detail of the representative semiconductor packages mounted to the PCB.
Figure 3B:
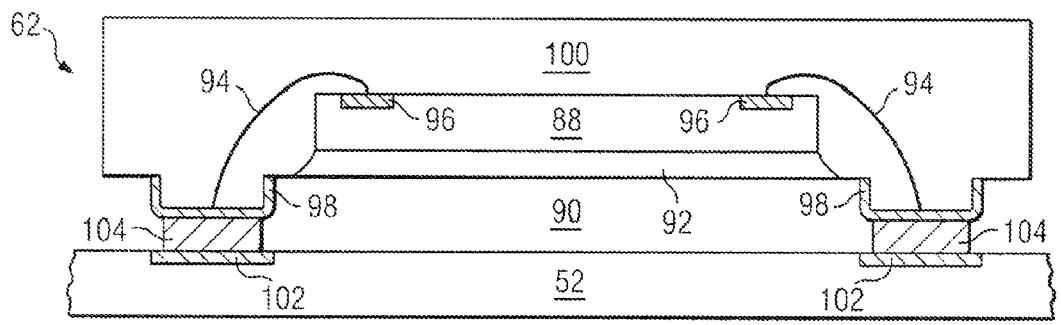
Figure 3C:
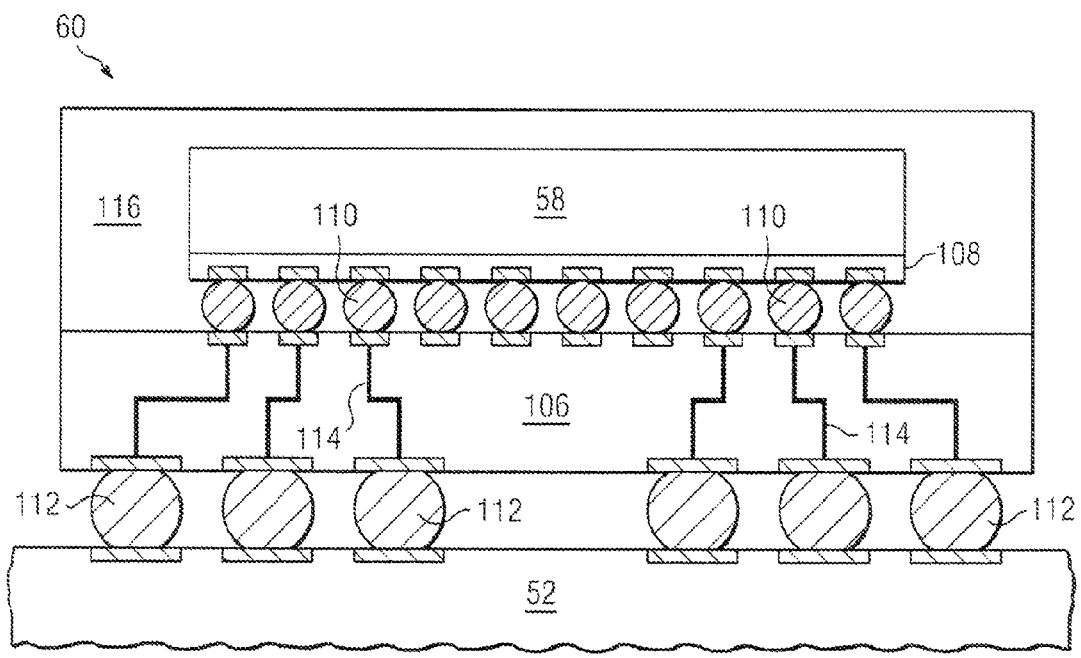

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 3b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 4A:
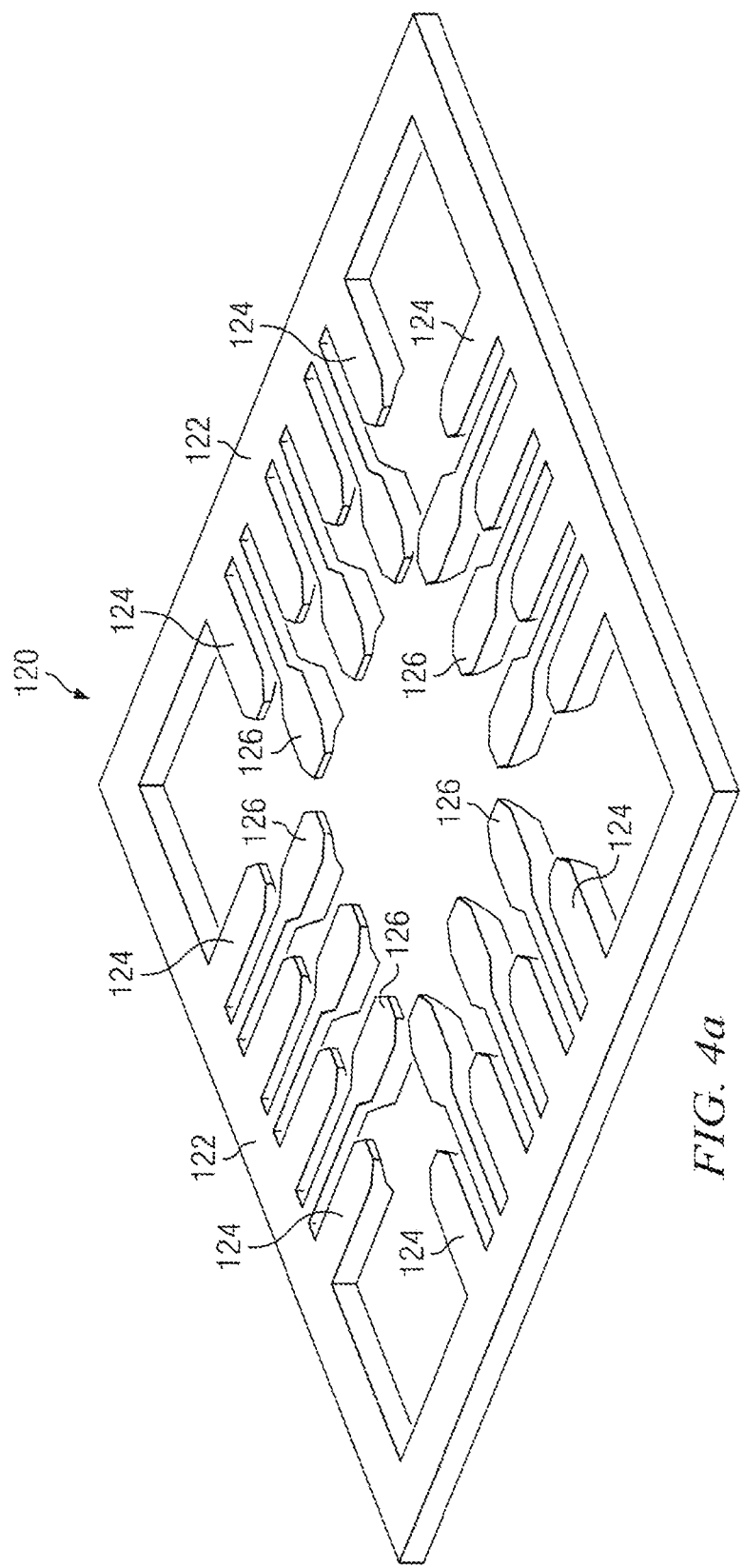
FIGS. 4a-4e illustrate a process of forming a QFN containing semiconductor die stacked over a leadframe and electrically interconnected by conductive pillars.

FIGS. 4a-4e illustrate, in relation to FIGS. 2 and 3a-3c, a process of forming multiple stacked semiconductor die in a QFN electrically interconnected with conductive pillars and bumps. In FIG. 4a, leadframe 120 is adapted for receiving a semiconductor die. The semiconductor die can be attached to a substrate or leadframe for structural support and interconnection. In one embodiment, leadframe 120 is an un-singulated flat pre-molded laminated substrate. Leadframe 120 includes a dambar structure 122 around a perimeter of the leadframe with a plurality of integrated fingers or contact pads 124 and 126 arranged in dual rows. The row of contact pads 124 and row of contact pads 126 have different lengths extending from dambar 122 and are offset to increase packing density. Leadframe 120 is made with gold, silver, nickel, platinum, copper, copper alloys (including one or more elements of nickel, iron, zinc, tin, chromium, silver, and phosphorous), or other suitable materials. The dambar structure 122 is removed in a subsequent manufacturing step, e.g., before electrical testing.

Figure 4B:
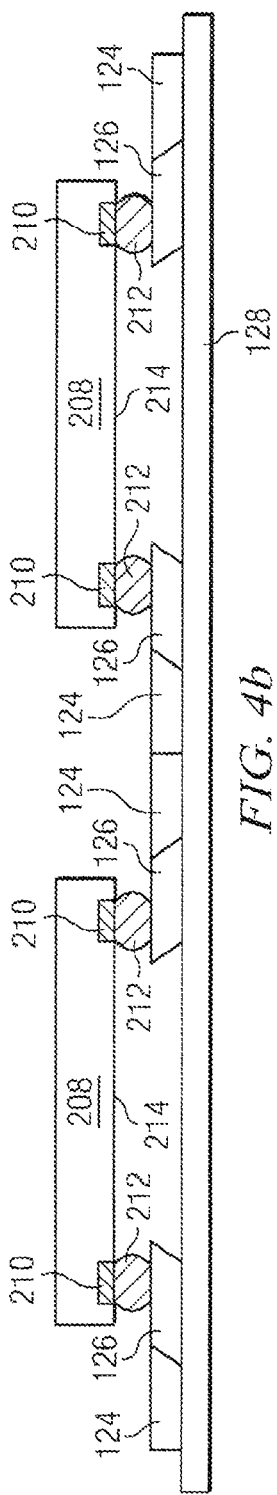

In FIG. 4b, a substrate or carrier 128 contains temporary or sacrificial base material such as silicon, polymer, polymer composite, metal, ceramic, glass, glass epoxy, beryllium oxide, or other suitable low-cost, rigid material or bulk semiconductor material for structural support. Leadframe 120 is mounted to temporary carrier 128. A semiconductor die or component 208 with contact pads 210 oriented downward in a flipchip arrangement is mounted to contact pads 126 with bumps 212. Semiconductor die 208 includes an active surface 214 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 214 to implement analog circuits or digital circuits, such as DSP, ASIC, memory, or other signal processing circuit. Semiconductor die 208 may also contain IPD, such as inductors, capacitors, and resistors, for RF signal processing. A typical RF system requires multiple IPDs in one or more semiconductor packages to perform the necessary electrical functions.

Figure 4C:
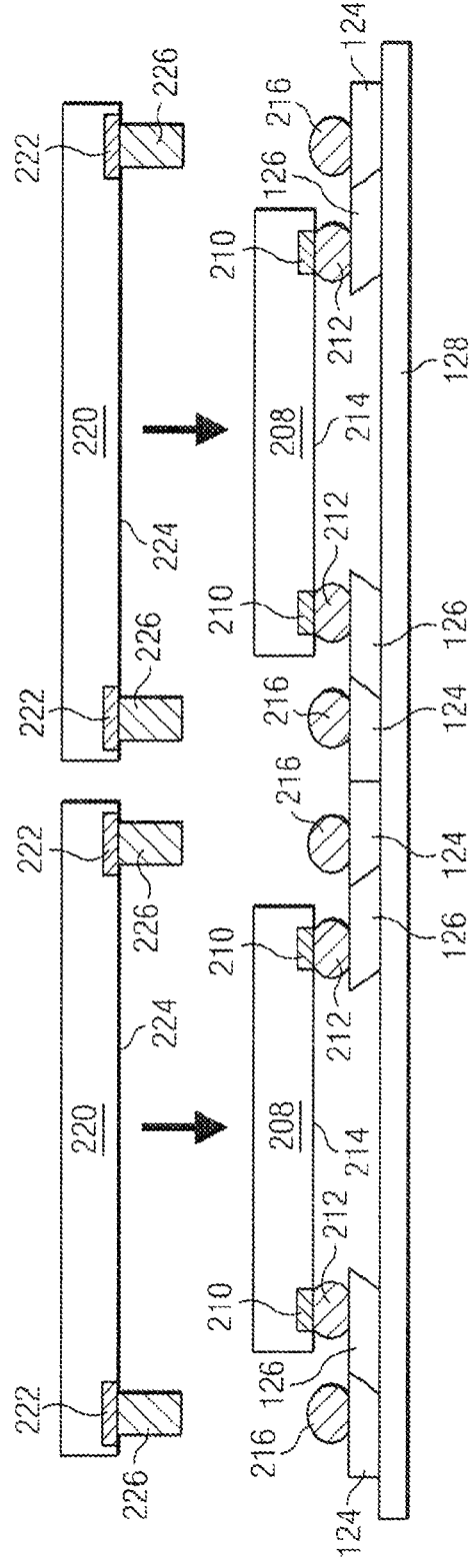

In FIG. 4c, an electrically conductive bump material is deposited over contact pad 124 of leadframe 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pad 124 using a suitable attachment or bonding process. In one embodiment, the bump material is reflowed by heating the material above its melting point to form spherical balls or bumps 216. In some applications, bumps 216 are reflowed a second time to improve electrical connection to contact pad 124. The bumps can also be compression bonded to contact pad 124. Bumps 216 represent one type of interconnect structure that can be formed over contact pad 124. The interconnect structure can also use bond wires, conductive paste, stud bump, micro bump, or other electrical interconnect.

A semiconductor die or component 220 has contact pads 222 electrically connected to active surface 224. Semiconductor die 220 is larger than semiconductor die 208. Active surface 224 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 224 to implement analog circuits or digital circuits, such as DSP, ASIC, memory, or other signal processing circuit. Semiconductor die 220 may also contain IPD, such as inductors, capacitors, and resistors, for RF signal processing. A typical RF system requires multiple IPDs in one or more semiconductor packages to perform the necessary electrical functions.

Figure 4D:
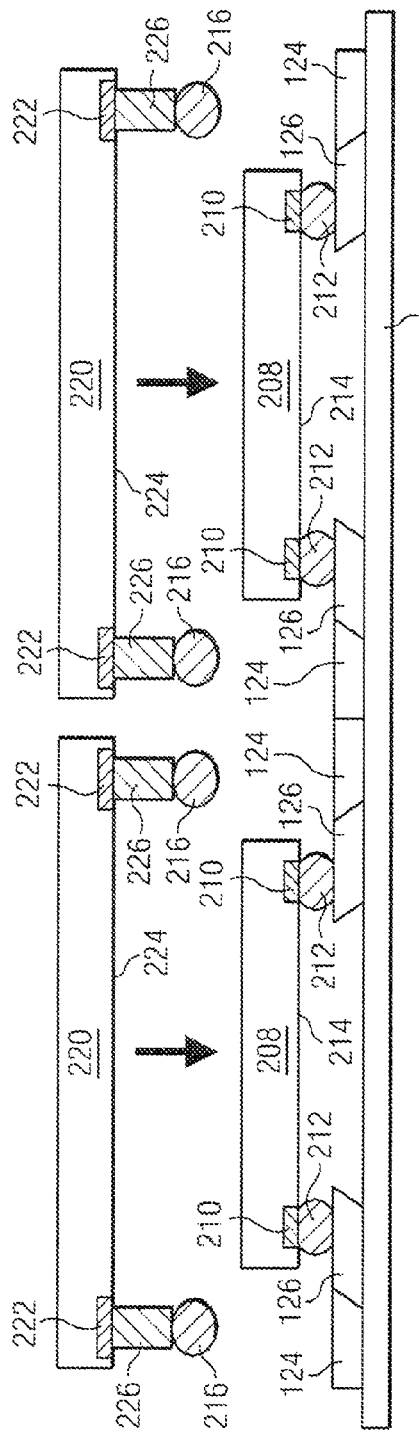

One or more layers of photoresist are deposited over active surface 224 of semiconductor die 220 at the wafer level. A portion of the photoresist over contact pads 222 is exposed and removed by an etch development process to form a trench. Conductive material, such as Al, Cu, Sn, Ni, Au, Ag, Ti, W, solder, poly-silicon, or combination thereof, is deposited in the trench using a selective plating process. In one embodiment, a column of Cu is deposited in the trench, followed by a layer of solder over the Cu. The photoresist is stripped away leaving behind individual conductive pillars 226. In another embodiment, conductive pillars 226 can be formed as stud bumps or stacked bumps. Semiconductor die 220 is then mounted to bumps 216 using conductive pillars 226. Bumps 216 can be formed on conductive pillars 226 at the wafer level, prior to mounting semiconductor die 220 to contact pads 124, as shown in FIG. 4d.

Figure 4E:
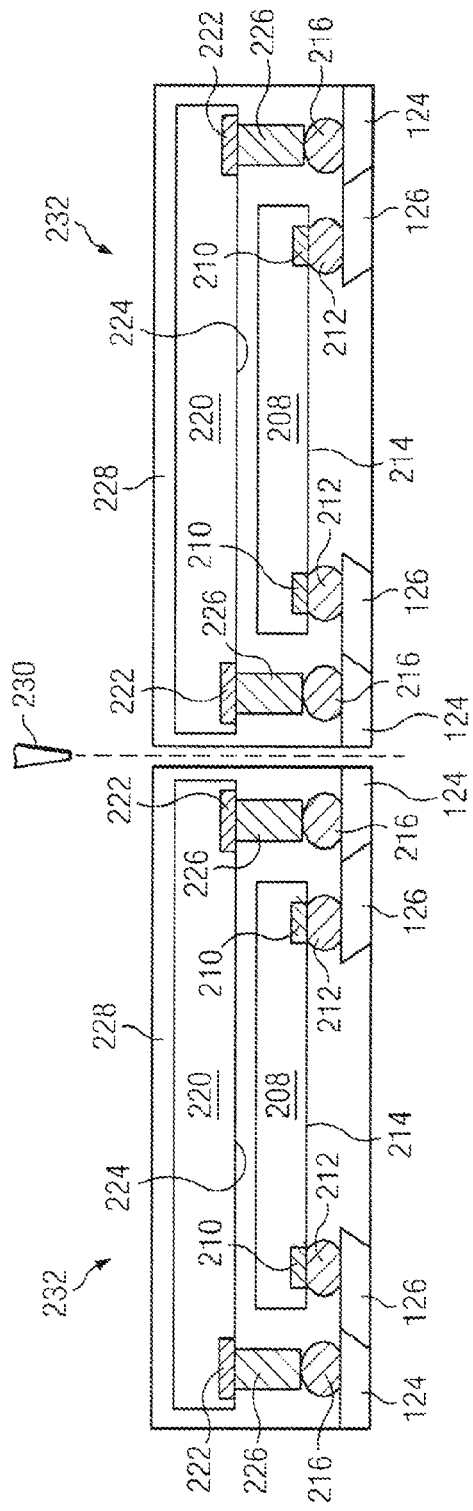

FIG. 4e shows semiconductor die 220 mounted to semiconductor die 208. Since semiconductor die 220 is larger than semiconductor die 208, a portion of die 220 overhangs with respect to die 208. An encapsulant or molding compound 228 is deposited over semiconductor die 208 and 220 and around conductive pillars 226 using a paste printing, compressive molding, transfer molding, liquid encapsulant molding, vacuum lamination, spin coating, or other suitable applicator. Encapsulant 228 can be polymer composite material, such as epoxy resin with filler, epoxy acrylate with filler, or polymer with proper filler. Encapsulant 228 is non-conductive and environmentally protects the semiconductor device from external elements and contaminants. The temporary carrier 128 is are removed by chemical etching, mechanical peel-off, CMP, mechanical grinding, thermal bake, laser scanning, or wet stripping. Leadframe 120 is then singulated using saw blade or laser cutting device 230 into individual QFN structures.

The active and passive circuit elements in semiconductor die 208 electrically connect to other circuit elements in semiconductor die 220 through conductive pillars 226, bumps 212 and 216, and leadframe 120. In QFN 232, the multiple flipchip semiconductor die are vertically stacked over leadframe 120 and electrically interconnected through conductive pillars 226 to increase pin count and reduce pitch. Two or more semiconductor die can be stacked and electrically interconnected using the process of FIGS. 4a-4e. Semiconductor die 208 is electrically interconnected using bumps 212 because the die is relatively close, in the vertical direction, to contact pads 126. Semiconductor die 220 is electrically connected with bumps 216 and conductive pillars 226 because of the greater distance from the overhanging portion of the die to contact pads 124. The combination of bumps 216 and conductive pillars 226 provides good collapse after reflow. Additional even larger semiconductor die can be stacked over semiconductor die 220 and electrically connects to contact pads on leadframe 120 using bumps and conductive pillars.

FIGS. 5a-5f illustrate, in relation to FIGS. 2 and 3a-3c, another process of forming multiple stacked semiconductor die in a QFN electrically interconnected with conductive pillars and bumps. Using leadframe 120 mounted to carrier 128 from FIGS. 4a-4b, an electrically conductive bump material is deposited over contact pad 126 of leadframe 120 using an evaporation, electrolytic plating, electroless plating, ball drop, or screen printing process, see FIG. 5a. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pad 126 using a suitable attachment or bonding process. In one embodiment, the bump material is reflowed by heating the material above its melting point to form spherical balls or bumps 130. In some applications, bumps 130 are reflowed a second time to improve electrical connection to contact pad 126. The bumps can also be compression bonded to contact pad 126. Bumps 130 represent one type of interconnect structure that can be formed over contact pad 126. The interconnect structure can also use bond wires, conductive paste, stud bump, micro bump, or other electrical interconnect.

A semiconductor die or component 132 with contact pads 134 oriented downward in a flipchip arrangement is mounted to bumps 130. Semiconductor die 132 includes an active surface 136 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 136 to implement analog circuits or digital circuits, such as digital signal processor (DSP), ASIC, memory, or other signal processing circuit. Semiconductor die 132 may also contain IPD, such as inductors, capacitors, and resistors, for RF signal processing. A typical RF system requires multiple IPDs in one or more semiconductor packages to perform the necessary electrical functions.

An electrically conductive bump material is also deposited over contact pad 124 of leadframe 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pad 124 using a suitable attachment or bonding process. In one embodiment, the bump material is reflowed by heating the material above its melting point to form spherical balls or bumps 138. In some applications, bumps 138 are reflowed a second time to improve electrical connection to contact pad 124. The bumps can also be compression bonded to contact pad 124. Bumps 138 represent one type of interconnect structure that can be formed over contact pad 124. The interconnect structure can also use bond wires, conductive paste, stud bump, micro bump, or other electrical interconnect.

Figure 5A:
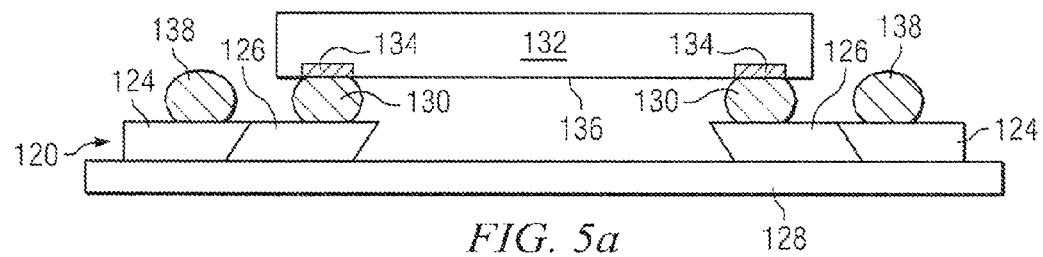
FIGS. 5a-5f illustrate another process of forming a QFN containing semiconductor die stacked over a leadframe and electrically interconnected by conductive pillars.
Figure 5B:
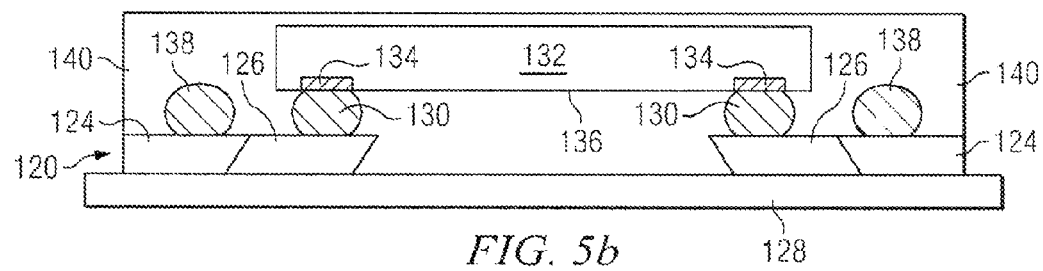
Figure 5C:
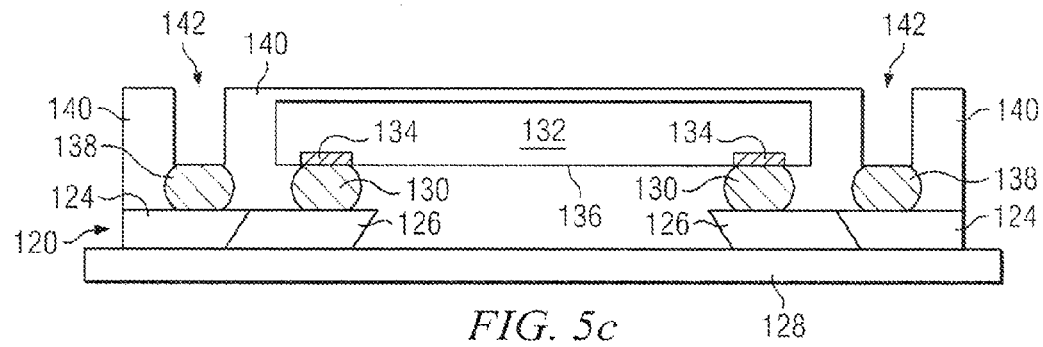
Figure 5D:
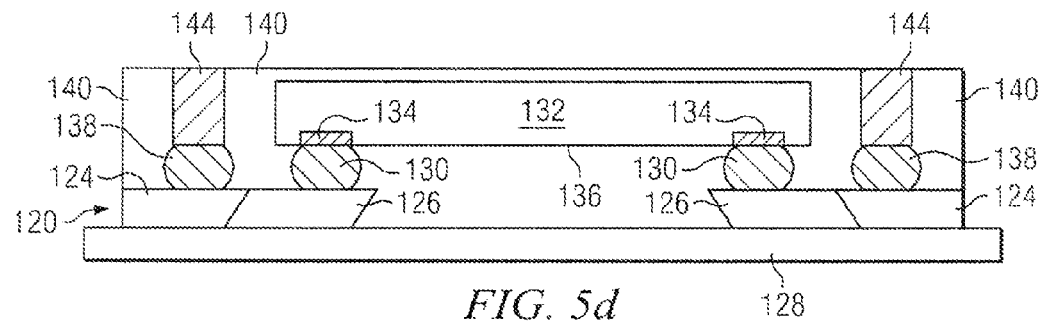
Figure 5E:
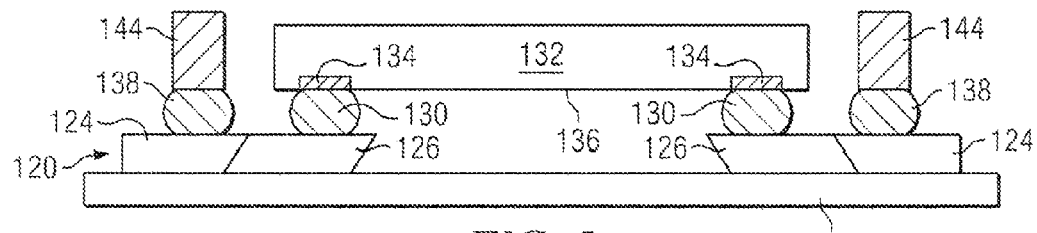

In FIG. 5b, one or more layers of photoresist 140 is deposited over leadframe 120, semiconductor die 132, and bumps 138. Photoresist 140 extends above semiconductor die 132. In FIG. 5c, the portion of photoresist 140 over bump 130 is exposed and removed by an etch development process to form trench 142. In FIG. 5d, conductive material, such as Al, Cu, Sn, Ni, Au, Ag, titanium (Ti), tungsten (W), solder, polysilicon, or combination thereof, is deposited in trench 142 using a selective plating process. In one embodiment, a column of Cu is deposited in trench 142, followed by a layer of solder over the Cu. In FIG. 5e, photoresist 140 is stripped away leaving behind individual conductive pillars 144. In another embodiment, conductive pillars 144 can be formed as stud bumps or stacked bumps.

Figure 5F:
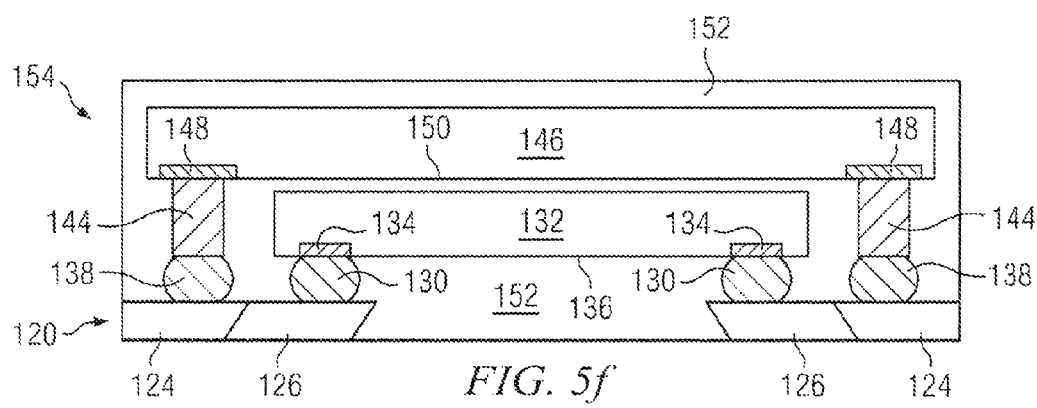

In FIG. 5f, a semiconductor die or component 146 with contact pads 148 oriented downward in a flipchip arrangement is mounted to conductive pillars 144. Semiconductor die 146 is larger than semiconductor die 142 and a portion of die 146 overhangs with respect to die 142. Semiconductor die 146 includes an active surface 150 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 150 to implement analog circuits or digital circuits, such as DSP, ASIC, memory, or other signal processing circuit. Semiconductor die 146 may also contain IPD, such as inductors, capacitors, and resistors, for RF signal processing. A typical RF system requires multiple IPDs in one or more semiconductor packages to perform the necessary electrical functions.

An encapsulant or molding compound 152 is deposited over semiconductor die 132 and 146 and around conductive pillars 144 using a paste printing, compressive molding, transfer molding, liquid encapsulant molding, vacuum lamination, spin coating, or other suitable applicator. Encapsulant 152 can be polymer composite material, such as epoxy resin with filler, epoxy acrylate with filler, or polymer with proper filler. Encapsulant 152 is non-conductive and environmentally protects the semiconductor device from external elements and contaminants. The temporary carrier 128 is are removed by chemical etching, mechanical peel-off, CMP, mechanical grinding, thermal bake, laser scanning, or wet stripping. Leadframe 120 is then singulated using saw blade or laser cutting device into individual QFN structures.

The active and passive circuit elements in semiconductor die 132 electrically connect to other circuit elements in semiconductor die 146 through conductive pillars 144, bumps 130 and 138, and leadframe 120. In QFN package 154, the multiple flipchip semiconductor die are vertically stacked over leadframe 120 and electrically interconnected through conductive pillars 144 to increase pin count and reduce pitch. Two or more semiconductor die can be stacked and electrically interconnected using the process of FIGS. 5a-5f. Semiconductor die 132 is electrically interconnected using bumps 130 because the die is relatively close, in the vertical direction, to contact pads 126. Semiconductor die 146 is electrically connected with bumps 138 and conductive pillars 144 because of the greater distance from the overhanging portion of the die to contact pads 124. The combination of bumps 138 and conductive pillars 144 provides good collapse after reflow. Additional even larger semiconductor die can be stacked over semiconductor die 146 and electrically connects to contact pads on leadframe 120 using bumps and conductive pillars.

Figure 6:
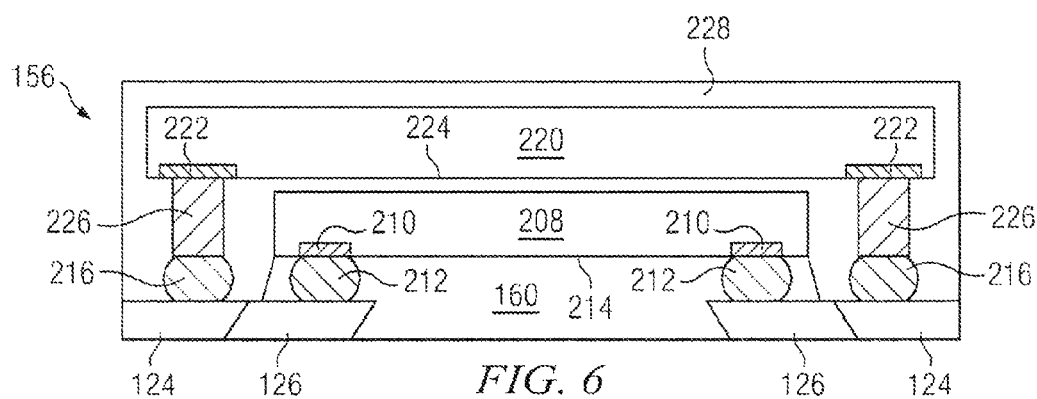
FIG. 6 illustrates semiconductor die stacked over the leadframe with underfill material.

FIG. 6 shows QFN package 156 with stacked semiconductor die 208 and 220 electrically connected by conductive pillars 226. An underfill material 160 such as epoxy resin is deposited beneath semiconductor die 208.

Figure 7:
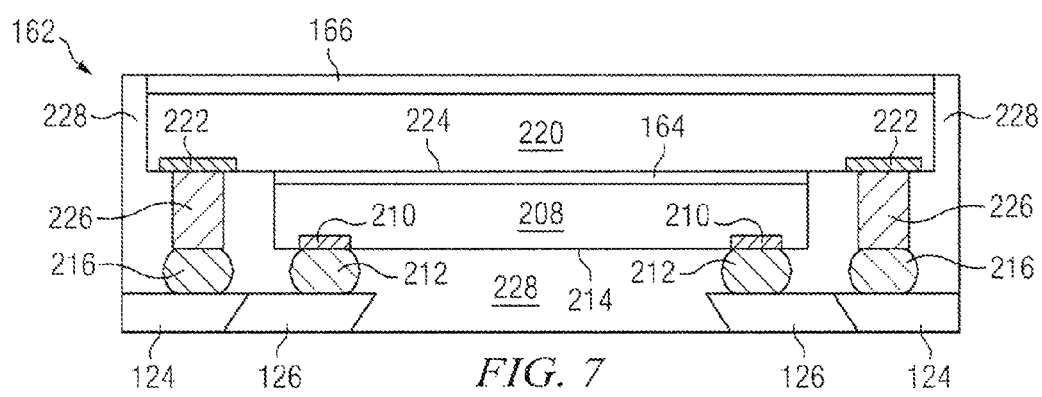
FIG. 7 illustrates semiconductor die stacked over the leadframe with heat sink and thermal interface material.

FIG. 7 shows QFN 162 with stacked semiconductor die 208 and 220 electrically connected by conductive pillars 226. A thermal interface material (TIM) 164 is deposited between semiconductor die 208 and 220 to aid with heat transfer between the devices. TIM 164 can be aluminum oxide, zinc oxide, boron nitride, or pulverized silver. A heat sink 166 is mounted over semiconductor die 220. Heat sink 166 can be Al, Cu, or another material with high thermal conductivity to provide heat dissipation for semiconductor die 208 and 220. Heat sink 166 also provides a protective surface for the backside of semiconductor die 220.

FIG. 8 shows QFN 170 with stacked semiconductor die 132 and 146 electrically connected by conductive pillars 174. From the structure described in FIG. 5c trench 142 is made wider than bumps 138. Trench 142 is filled with an insulating or dielectric layer 172. The insulating layer 172 can be one or more layers of silicon dioxide (SiO2), silicon nitride (Si3N4), silicon oxynitride (SiON), tantalum pentoxide (Ta2O5), aluminum oxide (Al2O3), polyimide, benzocyclobutene (BCB), polybenzoxazoles (PBO), or other dielectric material having similar insulating and structural properties. The insulating layer 172 is deposited using PVD, CVD, printing, sintering, or thermal oxidation. A via is formed through insulating layer 172 down to bump 138 using laser drilling or etching process. The via is filled with conductive material, such as Al, Cu, Sn, Ni, Au, Ag, Ti, W, solder, poly-silicon, or combination thereof. The photoresist is stripped away leaving behind individual conductive pillars 174. In another embodiment, conductive pillars 174 can be formed as stud bumps or stacked bumps. The remainder of the structure described in FIGS. 5d-5f is added to QFN 170.

FIG. 9 shows semiconductor die 208 and 220 stacked on plated-lead type QFN leadframe 180 containing four rows of contact pads 182a, 182b, 182c, and 182d. The QFN can be strip edge (QFN-se) or dual row (QFN-dr). Each row of contact pads 182a-182d may be electrically isolated. Bumps 212 are formed on contact pads 182b and 182c. Bumps 216 are formed on contact pads 182a and 182d. The remainder of the structure described in FIGS. 4b-4e, including conductive pillars 226, is added to QFN 180.

FIG. 10 shows semiconductor die 208 and 220 stacked on plated-lead type QFN leadframe 190 containing four rows of contact pads 192a, 192b, 192c, and 192d. Contact pads 192a and 192d are thicker than contact pads 192b and 192c. Bumps 212 are formed on contact pads 192b and 192c. Bumps 194 are formed on contact pads 192a and 192d. Conductive pillars 196 are formed over bumps 194, as described in FIGS. 4c-4d or 5b-5d. The remainder of the structure described in FIG. 4e or 5e-5f is added to QFN 190.

Figure 11:
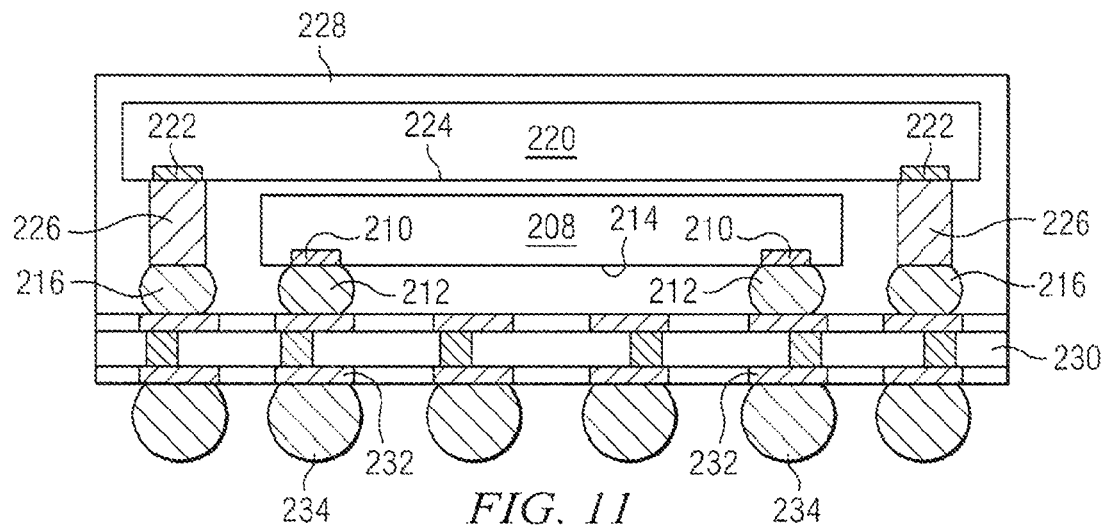
FIG. 11 illustrates semiconductor die stacked over a substrate and electrically interconnected by conductive pillars.

FIG. 11 shows semiconductor die 208 and 220 mounted to substrate 230. Substrate 230 can be made with laminate, flex, or silicon material. Substrate 230 includes interconnect structure 232 electrically connecting bumps 212 and 216 to bumps 234. The interconnect structure between semiconductor die 208 and 220 and substrate 230, including bumps 212 and 216, conductive pillars 226, and encapsulant 228, follow the process flow of FIGS. 4b-4e or 5a-5f with respect to substrate 230.

Figure 12:
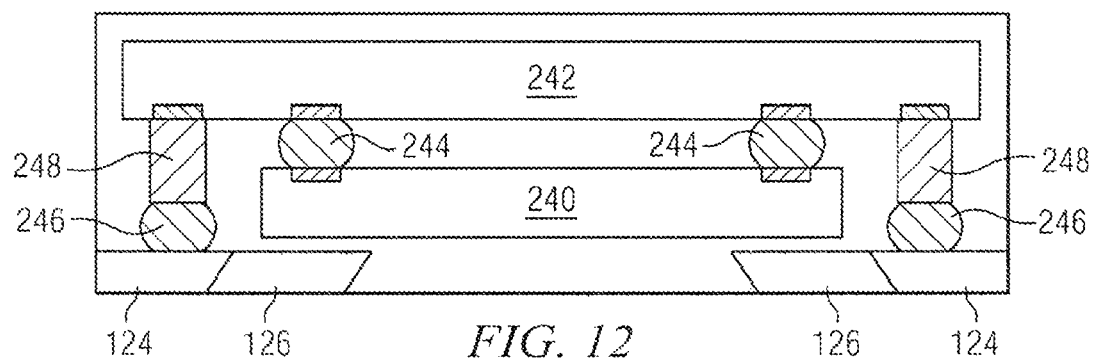
FIG. 12 illustrates semiconductor die stacked over the leadframe with the lower die attached to the upper die and electrically interconnected by conductive pillars.

FIG. 12 shows semiconductor die 240 mounted to semiconductor die 242 with bumps 244. Semiconductor die 242 is electrically connected to contact pads 124 of leadframe 120 with bumps 246 and conductive pillars 248 similar to FIGS. 4b-4e or 5a-5f.

Figure 13:
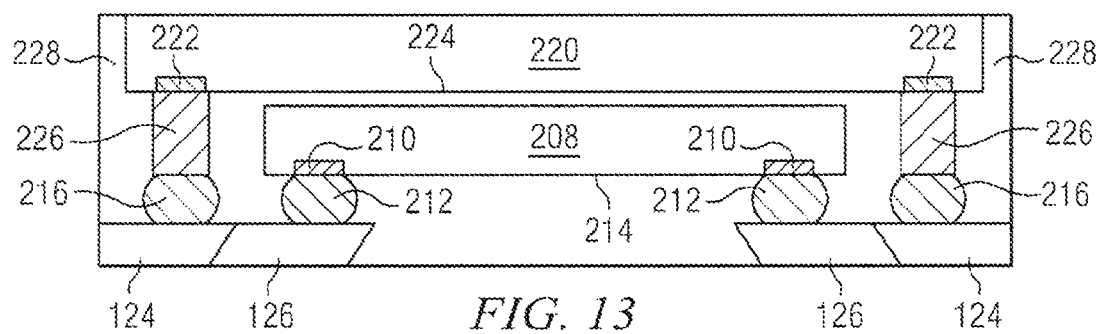
FIG. 13 illustrates semiconductor die stacked over a substrate with a back surface of the upper die exposed.

FIG. 13 shows the embodiment of FIG. 4e with a portion of encapsulant 228 removed to expose a backside of semiconductor die 220.

Figure 14:
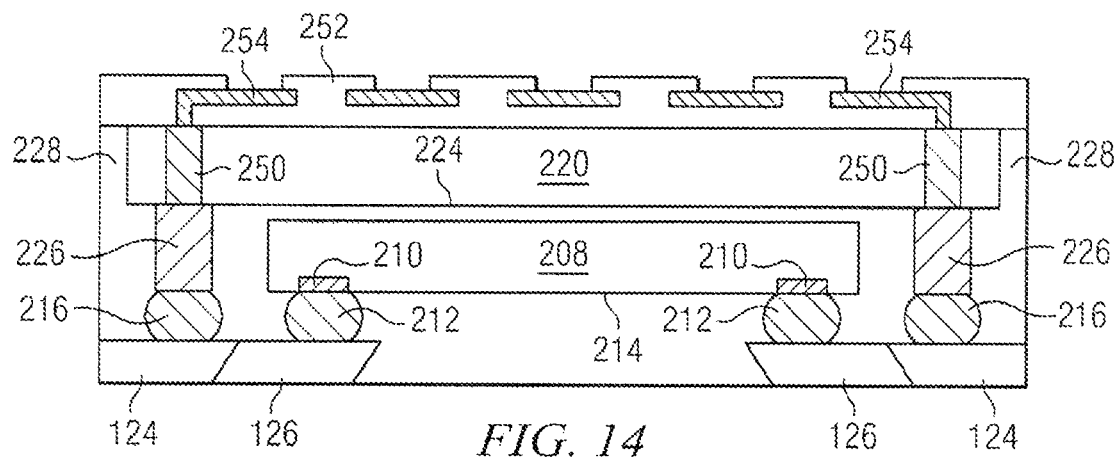
FIG. 14 illustrates semiconductor die stacked over a substrate with TSV in the upper die and topside RDL.

In FIG. 14, a plurality of vias is formed through semiconductor die 220 using laser drilling or etching process, such as deep reactive ion etching (DRIE). The vias are filled with Al, Cu, Sn, Ni, Au, Ag, titanium (Ti), W, poly-silicon, or other suitable electrically conductive material using PVD, CVD, electrolytic plating, electroless plating process, or other suitable metal deposition process to form conductive through silicon vias (TSV) 250.

A passivation layer 252 is formed over the backside of semiconductor die 220 using PVD, CVD, printing, spin coating, spray coating, sintering, or thermal oxidation. The passivation layer 252 can be one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The conductive layer 254 is formed over passivation layer 252 using PVD, CVD, evaporation, electrolytic plating, electroless plating, screen printing, or other suitable metal deposition process. Conductive layer 254 operates as signal traces or redistribution layers (RDL) electrically connected to TSV 250. The conductive layer 254 can be one or more layers of Al, Cu, Sn, Ni, Au, Ag, or other suitable electrically conductive material.

Figure 15:
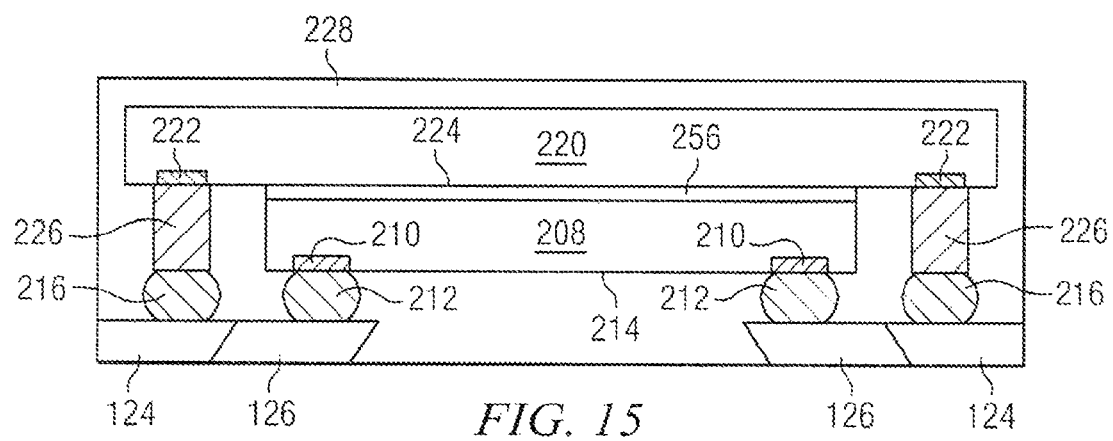
FIG. 15 illustrates semiconductor die stacked over a substrate and shielding layer between the die.

In FIG. 15, to reduce electromagnetic interference (EMI) and radio frequency interference (RFI), an electrically conductive shielding layer 256 is deposited between semiconductor die 208 and 220. Shielding layer 256 can be Cu, Al, soft-magnetic materials such as ferrite or carbonyl iron, stainless steel, nickel silver, low-carbon steel, silicon-iron steel, foil, epoxy, conductive resin, and other metals and composites capable of blocking or absorbing EMI, RFI, and other inter-device interference. Alternatively, shielding layer 110 can be a dielectric material such as carbon-black or aluminum flake to reduce the effects of EMI and RFI. A shielding cage can be formed over semiconductor die 208 and 220 and grounded to leadframe 120.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a substrate including a dambar structure, a plurality of first fingers extending inward from the dambar structure, and a plurality of second fingers extending from the dambar structure in alternating position and offset in length with respect to the plurality of first fingers;
    disposing a first semiconductor die over the plurality of first fingers of the substrate;
    disposing a second semiconductor die including a plurality of conductive pillars over the first semiconductor die and the plurality of second fingers of the substrate; and
    disposing a plurality of first bumps between the conductive pillars of the second semiconductor die and the plurality of second fingers of the substrate.

2. The method of claim 1, further including disposing a plurality of second bumps between the first semiconductor die and substrate.

3. The method of claim 1, further including depositing an underfill material beneath the first semiconductor die.

4. The method of claim 1, further including disposing a heat sink over the second semiconductor die.

5. The method of claim 1, further including forming a shielding layer between the first semiconductor die and second semiconductor die.

6. The method of claim 1, further including forming an insulating material around the conductive pillars.

7. The method of claim 1, further including depositing an encapsulant over the first semiconductor die and second semiconductor die.

8. A method of making a semiconductor device, comprising:
    providing a substrate including a first contact pad and a second contact pad, wherein the first and second contact pads extend from a perimeter of the substrate toward an opening in a central region of the substrate and are connected at the perimeter of the substrate;
    disposing a first semiconductor component over the first contact pad and the central region of the substrate;

disposing a second semiconductor component over the first semiconductor component and the substrate; and disposing a conductive pillar between the second semiconductor component and the second contact pad of the substrate outside a footprint of the first semiconductor component.

9. The method of claim 8, further including forming the conductive pillar over the second semiconductor component prior to disposing the second semiconductor component over the first semiconductor component and substrate.

10. The method of claim 8, further including forming the conductive pillar over the substrate prior to disposing the second semiconductor component over the first semiconductor component and substrate.

11. The method of claim 8, further including depositing an underfill material beneath the first semiconductor component.

12. The method of claim 8, further including disposing a heat sink over the second semiconductor component.

13. The method of claim 8, further including forming a shielding layer between the first semiconductor component and second semiconductor component.

14. The method of claim 8, further including forming an interconnect structure over the second semiconductor component opposite the substrate.

15. The method of claim 8, further including depositing an encapsulant over the first semiconductor component and second semiconductor component.

16. The method of claim 15, further including planarizing the encapsulant with the second semiconductor component.

17. The method of claim 15, further including forming an interconnect structure over the encapsulant.

18. The method of claim 8, further including forming a plurality of bumps between the first semiconductor component and second semiconductor component.

19. The method of claim 8, further including forming a plurality of conductive vias through the second semiconductor component.

20. The method of claim 1, wherein a thickness of the second fingers is greater than a thickness of the first fingers.

21. The method of claim 1, wherein the plurality of first fingers and the plurality of second fingers extend from the dambar structure toward a central region of the substrate devoid of substrate material.

22. A semiconductor device, comprising:

a substrate including a first contact pad and a second contact pad, wherein the first and second contact pads extend from a perimeter of the substrate toward an opening in a central region of the substrate and are connected at the perimeter of the substrate;

a first semiconductor component disposed over the first contact pad and the central region of the substrate;

a second semiconductor component disposed over the first semiconductor component and the substrate; and a conductive pillar disposed between the second semiconductor component and the second contact pad of the substrate outside a footprint of the first semiconductor component.

23. The semiconductor device of claim 22, further including an underfill material disposed beneath the first semiconductor component.

24. The semiconductor device of claim 22, further including a heat sink disposed over the second semiconductor component.

25. The semiconductor device of claim 22, further including a shielding layer disposed between the first semiconductor component and second semiconductor component.

26. The semiconductor device of claim 22, further including an interconnect structure formed over the second semiconductor component opposite the substrate.

27. The semiconductor device of claim 22, further including an encapsulant deposited over the first semiconductor component and second semiconductor component.

28. The semiconductor device of claim 27, wherein the encapsulant is planarized with the second semiconductor component.

29. The semiconductor device of claim 27, further including an interconnect structure formed over the encapsulant.

30. The semiconductor device of claim 22, further including a plurality of bumps formed between the first semiconductor component and second semiconductor component.

31. The semiconductor device of claim 22, further including a plurality of conductive vias formed through the second semiconductor component.

* * * * *